United States Patent
Zhang

(10) Patent No.: US 12,341,133 B2
(45) Date of Patent: Jun. 24, 2025

(54) STACKED DIE RF CIRCUITS AND PACKAGE METHOD THEREOF

(71) Applicant: Chengdu Sicore Semiconductor Corp. Ltd., Chengdu (CN)

(72) Inventor: Cemin Zhang, Chino, CA (US)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 613 days.

(21) Appl. No.: 17/835,650

(22) Filed: Jun. 8, 2022

(65) Prior Publication Data

US 2023/0317682 A1 Oct. 5, 2023

(30) Foreign Application Priority Data

Mar. 29, 2022 (CN) .......................... 202210320285.1

(51) Int. Cl.
| | |
|---|---|
| *H01L 25/065* | (2023.01) |
| *H01L 23/00* | (2006.01) |
| *H01L 23/48* | (2006.01) |
| *H01L 23/522* | (2006.01) |
| *H01L 23/528* | (2006.01) |

(52) U.S. Cl.
CPC ........ *H01L 25/0657* (2013.01); *H01L 23/481* (2013.01); *H01L 23/5226* (2013.01); *H01L 23/528* (2013.01); *H01L 24/14* (2013.01); *H01L 2224/0401* (2013.01); *H01L 2224/73204* (2013.01); *H01L 2224/81815* (2013.01)

(58) Field of Classification Search
None
See application file for complete search history.

(56) References Cited

U.S. PATENT DOCUMENTS

| | | | |
|---|---|---|---|
| 8,594,610 B2 | 11/2013 | Misra | |
| 9,129,929 B2* | 9/2015 | Lundberg | ................ H01L 23/34 |
| 9,929,123 B2 | 3/2018 | Zhang et al. | |
| 2013/0063843 A1* | 3/2013 | Chen | ................. H01L 23/49811 |
| | | | 361/56 |
| 2015/0340366 A1* | 11/2015 | Lim | ...................... G11C 16/10 |
| | | | 257/401 |

\* cited by examiner

*Primary Examiner* — Timothy J Thompson
*Assistant Examiner* — John B Freal
(74) *Attorney, Agent, or Firm* — Michael North

(57) ABSTRACT

Various embodiments for die stacking are disclosed in the present disclosure for improved performance in RF circuit integration and packaging. In various layouts, a first die may be flipped and stacked on a second die via one or more bumping pillars coupled between the dies. The bumping pads may be disposed on the first die, the second die, or both. The bumping pads may comprise ground bumping pads for ground connection, RF signal bumping pads for cross-die RF signal transmission, and/or control bumping pads for biasing or logic control. Furthermore, the ground bumping pads and the RF signal bumping pad may form a ground-signal-ground pad structure for smooth RF signal transmission. The present embodiments may integrate a silicon-based die with an III-V semiconductor-based die together for a small form factor package with the well-defined ground to handle RF signals over millimeter-wave frequencies at high power levels.

13 Claims, 6 Drawing Sheets

STACKED DIE RF CIRCUITS AND PACKAGE METHOD THEREOF

CROSS-REFERENCE TO RELATED APPLICATIONS

This application claims foreign priority to Chinese Patent Application No. 202210320285.1, entitled "STACKED DIE RF CIRCUITS AND PACKAGE METHOD THEREOF", naming Cemin Zhang as inventor, and filed Mar. 29, 2022, the subject matter of which is hereby incorporated herein by reference.

BACKGROUND

A. Technical Field

The present invention relates generally to radio frequency (RF) circuit structures, and more particularly to stacked die RF circuits.

B. Background of the Invention

Radio frequency (RF) or microwave/millimeter-wave frequency circuits typically comprise dielectric material, which may consume excessive dielectric heating power under high RF frequency. Advanced silicon-based manufacturing processes, such as RF bulk complementary metal-oxide-semiconductor (CMOS), silicon-on-insulator (SOI) CMOS, silicon-germanium (SiGe) bipolar-CMOS (BiCMOS), etc., are known for performances at high frequency, i.e. $f_t/f_{max}$ exceeding 300 GHz, and high integration. The high level of integration may enable a combination of analog/RF/microwave/millimeter-wave circuits and digital circuits in a single chip.

However, for silicon-based processes, it is very difficult and expensive to provide a backside ground (GND) plane with the integration of through-substrate-via. At millimeter-wave frequencies, the lack of a well-defined RF GND reference has been a known issue. Furthermore, for silicon-based technologies, due to a low device breakdown voltage, it is difficult to output relatively high power signals (e.g., saturated output power exceeds 15 dBm), especially at millimeter-wave frequencies.

III-V semiconductors (such as GaAs, GaN, InP, etc.) have been used in wide applications in high-performance millimeter-wave circuits. It is easy to implement a backside GND plane with the integration of through-substrate via. RF circuits using III-V semiconductors may output high power signals (saturated output power greater than 15 dBm) due to higher device breakdown voltage compared to silicon-based processes. However, for III-V semiconductor-based processes, it is very difficult to integrate digital logic circuits and basic analog circuits, such as operational amplifiers, low-dropout (LDO) regulators, DC-DC level shifters, negative voltage generators, etc. As a result, the level of integration for III-V semiconductor-based circuits is limited.

Accordingly, there is a need for systems and methods for RF circuit integration to address the above issues for improved performance.

SUMMARY OF THE INVENTION

The present disclosure provides system and method embodiments for die stacking for improved performance in RF circuit integration and packaging. In various layouts, a first die may be flipped and stacked on a second die via one or more bumping pillars coupled between the first die and the second die. The bumping pads may be disposed on the first die, the second die, or both. The bumping pads may comprise ground bumping pads for ground connection, signal bumping pads for cross-die RF signal transmission, and/or control bumping pads for biasing or logic control.

In one or more embodiments, the first die may be a silicon-based RF chip comprising an RF signal path coupled to the second die using at least one signal bumping pillar connecting corresponding signal bumping pads. The second die may be an III-V process semiconductor die such as GaAs/GaN die with a backside GND layer and one or more through-substrate GND vias to provide a well-defined GND reference for the second die. Furthermore, the second die may comprise an RF amplifier that has a saturated output power level greater than 15 dBm. Such integration of a silicon-based die with an III-V semiconductor-based die together provides a small form factor package with a well-defined ground to handle RF signals over millimeter-wave frequencies at a high power level.

In one or more embodiments, the first die may comprise a guard ring, which may be a closed ring or an open ring with at least one slit. The guard ring structure may be connected to one or more first-die ground bumping pads that are grounded to the backside GND layer on the second die through one or more ground bumping pillars. Such a grounded guard ring also provides a well-defined ground to the first die. Furthermore, the ground bumping pads and the RF signal bumping pad may form a ground-signal-ground, a ground-signal, or a signal-ground pad structure, which may have a similar characteristic impedance as the RF signal path on the first/second die for smooth RF signal transmission between the first die and the second die.

In one or more embodiments, the first die may further comprise one or more first-die control bumping pads connected to respective second-die control bumping pads through corresponding bumping pillars to form a control/bias port between the first die and the second die for bias or logic control.

Embodiments of the various layouts of two stacked dies provide a small form factor for RF applications, especially when small sizes are required or preferred. Such a stacked structure may further provide well-defined GND references for both dies. Embodiments of the cross-die RF connection structure, e.g., a ground-signal-ground, a ground-signal, or a signal-ground pad/pillar structure, are advantageous to reduce or minimize RF signal transmission loss between the stacked dies.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

Figure 1:
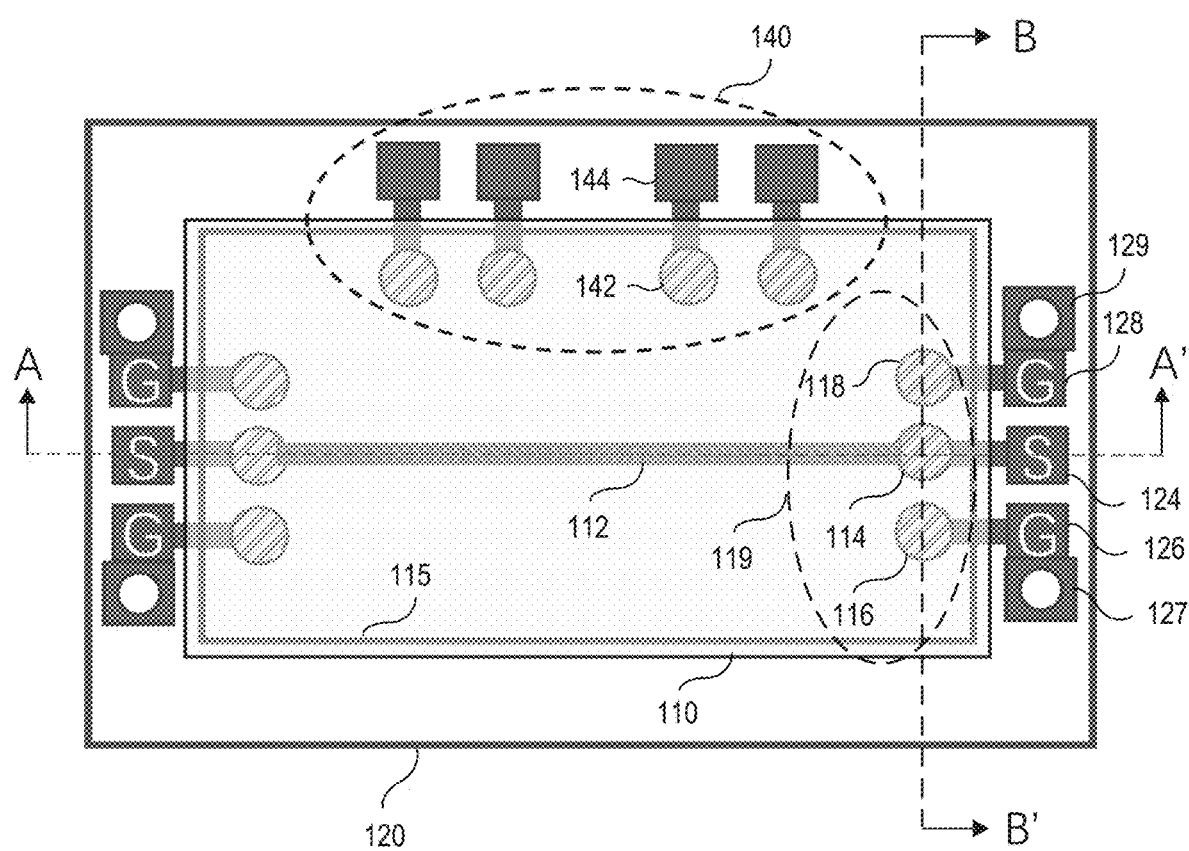
FIG. 1 depicts a top view of a first layout of two stacked dies, according to one or more embodiments of the invention.

One skilled in the art will recognize that various implementations and embodiments of the invention may be practiced in accordance with the specification. All of these implementations and embodiments are intended to be included within the scope of the invention.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagrams are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended to mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention. Each reference/document mentioned in this patent document is incorporated by reference herein in its entirety. It shall be noted that any examples provided herein are provided by way of illustration and were performed under specific conditions using a specific embodiment or embodiments; accordingly, neither these examples shall be used to limit the scope of the disclosure of the current patent document.

With the development of semiconductor technology, RF circuits have higher and higher integration for performance improvement. For silicon-based manufacturing processes, it is very challenging, if not impossible, to provide a backside GND plane with the integration of through-substrate-via and to output relatively high power signals. While for III-V semiconductors, its level of integration is limited due to difficulties in integrating digital logic circuits and basic analog/mixed-signal circuits, such as logic inverter, operational amplifier (OPA), low-dropout regulator (LDO), analog-to-digital converter (ADC), etc.

Various die stacking approaches have been proposed for different applications. U.S. Pat. No. 9,929,123B2 discloses a stacked structure comprising a first die and a second die flip-chip mounted on the first die. The first die has bumping pads electrically coupled to both ends of a first capacitive element. Bumps electrically connect a second capacitive element of the second die in parallel with the first capacitive element of the first die. The purpose of such a stack construction is to increase the Q factor of an LC resonant circuit.

Described herein are system and method embodiments of die stacking for improved performance in RF circuit integration and packaging.

Embodiment 1

Figure 2A:
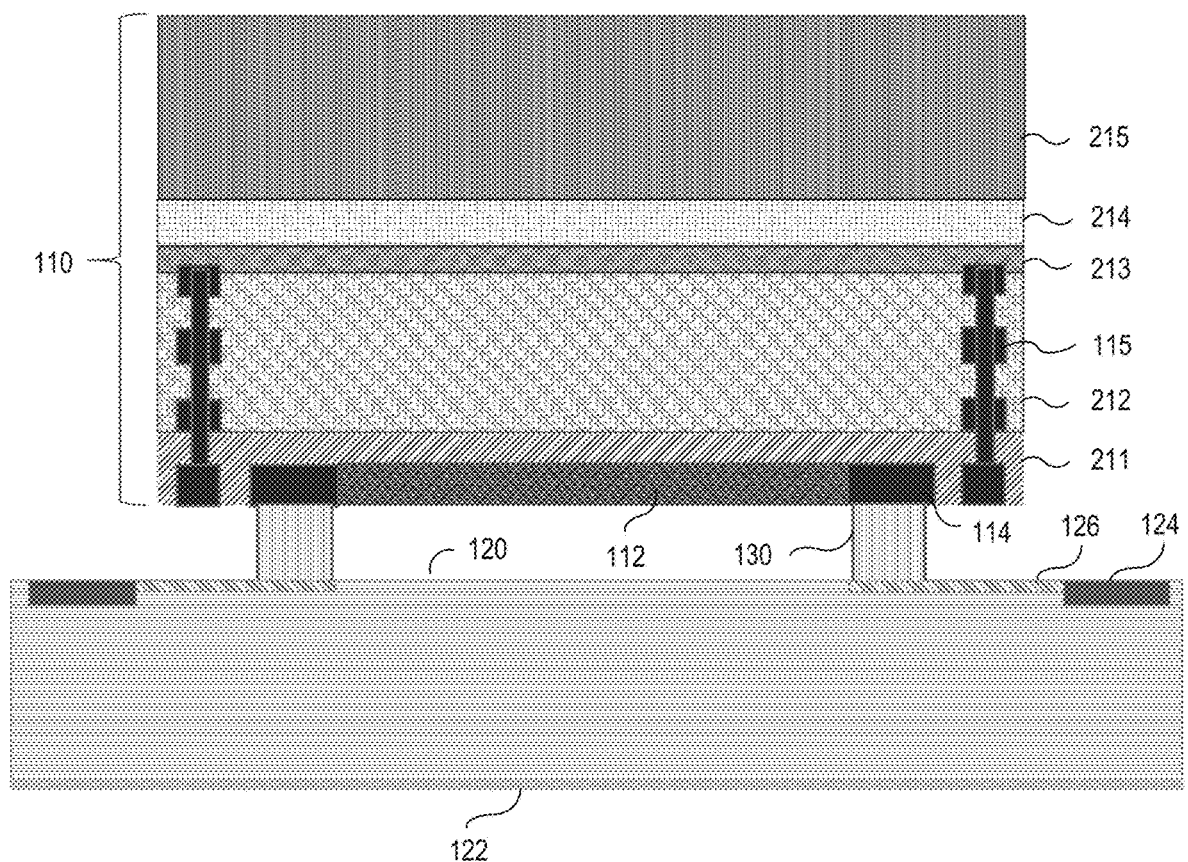
FIG. 2A depicts a first cross-sectional view of the first layout of two stacked dies, according to one or more embodiments of the invention.
Figure 2B:
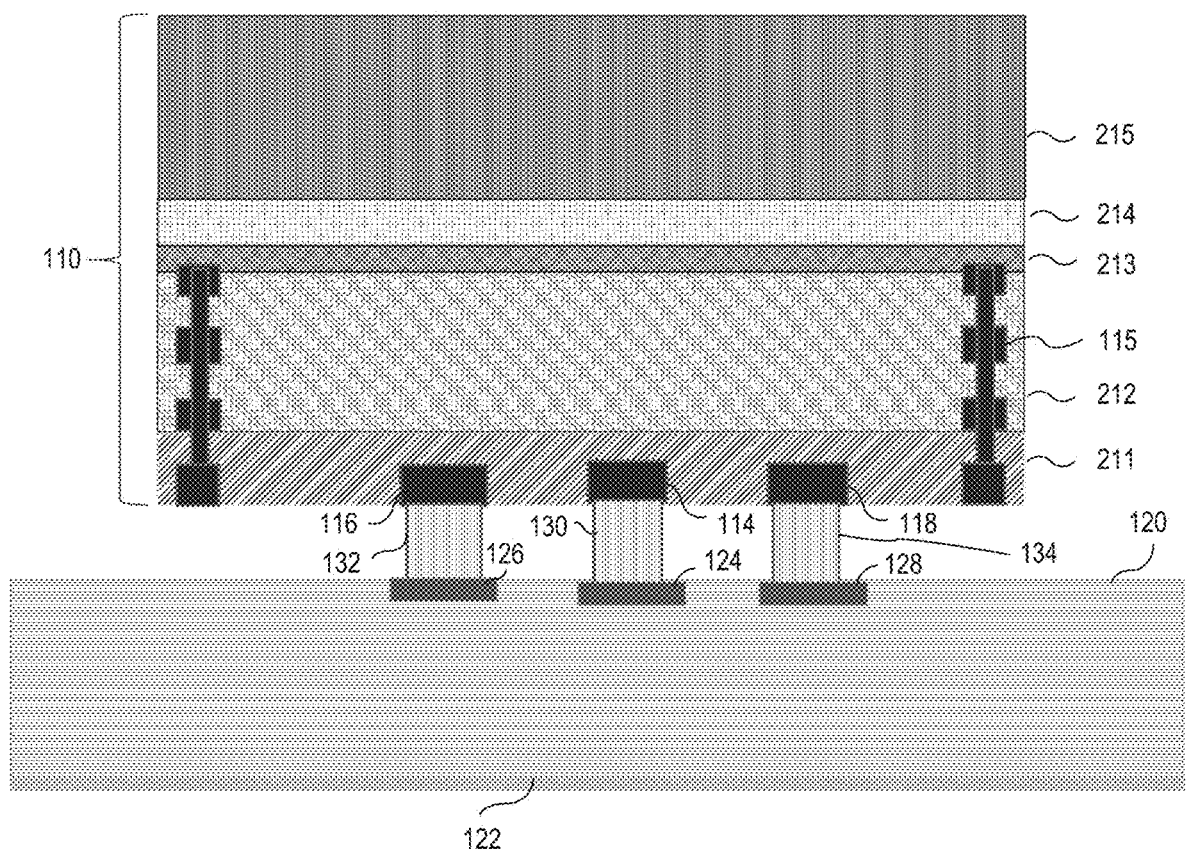
FIG. 2B depicts a second cross-sectional view of the first layout of two stacked dies, according to one or more embodiments of the invention.

FIG. 1 depicts a top view of a first layout of two stacked dies, according to one or more embodiments of the invention. FIG. 2A and FIG. 2B respectively depict cross-section views along line A-A' and line B-B' shown in FIG. 1. The stacked structure 100 comprises a first die 110 and a second die 120 coupled together via one or more bumping pillars, which serve as both mechanical and electrical connections between the first die and the second die. The one or more bumping pillars may comprise RF bumping pillars, e.g., 130, for RF signal transmission, and GND bumping pillars, e.g., 132 and 134, for GND connection. The first die 110 may be a flip die that flips and attaches to the second die 120. The first die 110 may be a silicon-based die and the second die 120 may be an III-V process semiconductor die, such as a gallium arsenide(GaAs) or a Gallium nitride(GaN) die. The III-V process semiconductor die may be referred to as a die manufactured with semiconductor elements in groups III and V of the periodic table of chemical elements as a substrate material.

In one or more embodiments, the second die 120 comprises a backside GND layer 122 and one or more through-substrate GND vias, e.g., 127 and 129, to provide a well-defined GND reference for the second die 120. The one or more through-substrate GND vias electrically connect to one or more second die GND pads, e.g., 126 and 128. The first die 110 comprises a guard ring 115 electrically connected to one or more first-die GND bumping pads, e.g., 116 and 118. Once the first die 110 and the second die 120 are stacked together, the one or more first-die GND bumping pads are electrically connected, via corresponding GND bumping pillars (132 and 134) and second-die GND pads(126 and 128), to corresponding through-substrate GND vias (127 and 129), and thus grounding the guard ring 115 for a well-defined GND reference for the first die.

In one or more embodiments, the guard ring 115 is an open (with at least one slit) or closed ring that laterally surrounds the first die 110. The guard ring 115 may be formed by a stack of back-end-of-line (BEOL) metal structures across a film (e.g., Oxide or SiN) layer 211 a low dielectric constant (low-k) dielectric layer 212, and a semiconductor layer 213. The first die 110 is a flipped die further comprising an insulator layer 214 and a handling wafer 215 above the semiconductor layer 213 (after chip flipped) as shown in FIG. 2A and FIG. 2B.

Furthermore, the first-die GND bumping pads 116 and 118 may be disposed on both sides of an RF signal bumping pad 114 to construct a ground-signal-ground (GSG) pad structure 119, which has a characteristic impedance matching the characteristic impedance of the RF signal path 112 for a smooth or low loss RF signal transmission into or out of the first die 110. With characteristic impedance matching, a voltage standing wave ratio (VSWR), a ratio between transmitted and reflected voltage standing waves, equal to or less than 2:1 may be achieved during RF signal transmission. GND bumping pillar 132 electrically connects the first-die GND bumping pad 116 to the second-die GND bumping pad 126. GND bumping pillar 134 electrically connects the first-die GND bumping pad 118 to the second-die GND bumping pad 128. The RF bumping pillar 130 electrically connects the RF signal bumping pad 114 to the second-die signal pad 124. The RF bumping pillars 130 and the GND bumping pillars 132 and 134 may also form a GSG pillar structure having characteristic impedance matching the GSG pad structure 119. One skilled in the art shall understand that although an RF signal path is illustrated as a straight line in FIG. 1, the RF signal path may involve various RF signal processing components, e.g., RF signal combiner or divider, and may involve various transmission-line forms such as microstrip line, coplanar-waveguide (CPW), or coplanar-waveguide with ground (CPWG), etc. Such variations shall still be within the scope of the present invention.

One skilled in the art shall also understand the ground bumping pad and the RF signal bumping pad may also form a ground-signal (GS) or a signal-ground (SG) pad structure instead of a GSG pad structure. Similarly, the ground bumping pillar and the signal bumping pillar may form a GS (or SG) pillar structure instead of a GSG pillar structure. Such variations shall also be within the scope of the present patent disclosure.

In one or more embodiments, the first die 110 may further comprise one or more first-die control bumping pads 142 connected to respective second-die control pads 144 through corresponding second-die bumping pillars(below and connected to the first-die control bumping pads 142) to form a bias/control port 140 between the first die 110 and the second die 120 for bias or logic control.

Embodiments of the first layout of two stacked dies provide a small form factor for RF applications, especially when a small size is required or preferred. Such a stacked structure provides well-defined GND references for both dies and cross-die connection structures to reduce or minimize RF signal transmission loss between the stacked dies. Both advantages are desired for RF signal processing, especially for RF signals over millimeter-wave frequencies.

Embodiment 2

Figure 3:
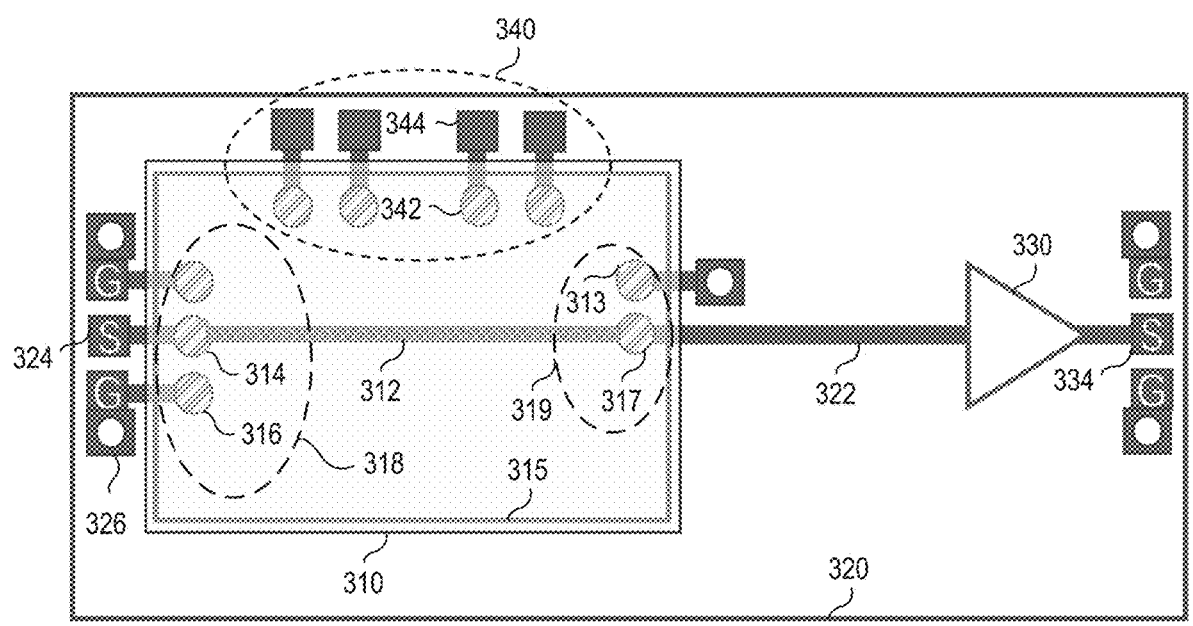
FIG. 3 depicts a top view of a second layout of two stacked dies, according to one or more embodiments of the invention.

FIG. 3 depicts a top view of a second layout of two stacked dies, according to one or more embodiments of the invention. The stacked structure 300 comprises a first die 310 and a second die 320 coupled together via one or more bumping pillars, which may comprise RF bumping pillars for RF signal transmission and GND bumping pillars for GND connection. The first die 310 may be a flip die that flips and attaches to the second die 320. The first die 310 may be a silicon-based die and the second die 320 may be an III-V process semiconductor die, such as a GaAs/GaN die. The second die has a backside GND layer and through-substrate GND vias, e.g., 326, to provide a well-defined GND reference for RF signals in both the first die and the second die.

The first die 310 may comprise a guard ring 315 electrically connected to one or more first-die GND bumping pads, e.g., 316, that are electrically connected, via corresponding GND bumping pillars, to corresponding through-substrate GND vias, e.g., 326. Therefore, the guard ring 315 is grounded for a well-defined GND reference for the first die. The first die 310 has a first-die signal input bumping pad 314 that is electrically connected to a second-die signal input pad 324 through an RF input bumping pillar for RF signal transmission. Similar to the first layout shown in FIG. 1 and FIGS. 2A-2B, the first-die GND bumping pads and the first-die signal bumping pad may form a first GSG (or GS or SG) pad structure 318, which has a characteristic impedance matching the characteristic impedance of a first-die RF signal path 312 for a smooth or low loss RF signal transmission from the second die to the first die. The first die 310 also has a first-die signal output bumping pad 317 coupled to the first-die RF signal path 312. The first-die signal output bumping pad 317 couples to a second-die RF signal path 322 via an RF bumping pillar. The second-die RF signal path 322 may have a similar characteristic impedance as the first-die RF signal path 312 for a smooth or low loss RF signal transmission. The first-die signal output bumping pad 317 may also form, with one or more nearby first-die GND bumping pads (e.g., 313), a second GSG (or GS or SG) pad structure 319, which may be similar to or different from the first GSG (or GS or SG) pad structure 318. For example, as shown in FIG. 3, the first pad structure 318 is a GSG pad structure, while the second pad structure 319 is an SG pad structure. In one or more embodiments, the characteristic impedance of the first pad structure 318 and the second pad structure 319 are matched, e.g., with an impedance difference below a predetermined threshold. With matched characteristic impedance, the VSWR equal to or less than 2:1 may be achieved during RF signal transmission.

The second-die 320 may be an III-V process semiconductor die, e.g., a GaAs/GaN die, comprising an RF amplifier 330 that has a saturated output power level greater than 15 dBm. The RF amplifier 330 has an input coupled to the first-die RF signal path 312 through the second-die RF signal path 322 and an output coupled to the second-die signal output pad 334 for amplified RF signal output.

Similar to the stacked structure 100 shown in FIG. 1, in the stacked structure 300, the first die 310 may further comprise one or more first-die control bumping pads 342 connected to respective second-die control bumping pads 344 through corresponding bumping pillars to form a control port 340 between the first die 310 and the second die 320 for bias or logic control.

Embodiments of the second layout of two stacked dies provide a small form factor for RF applications with well-defined GND references for both dies and the capability to handle RF signals over millimeter-wave frequencies. Additionally, the layout may output high power RF signals with saturated output power greater than 15 dBm, which makes the layout desirable for applications requiring both small form factors and high power outputs.

Embodiment 3

Figure 4:
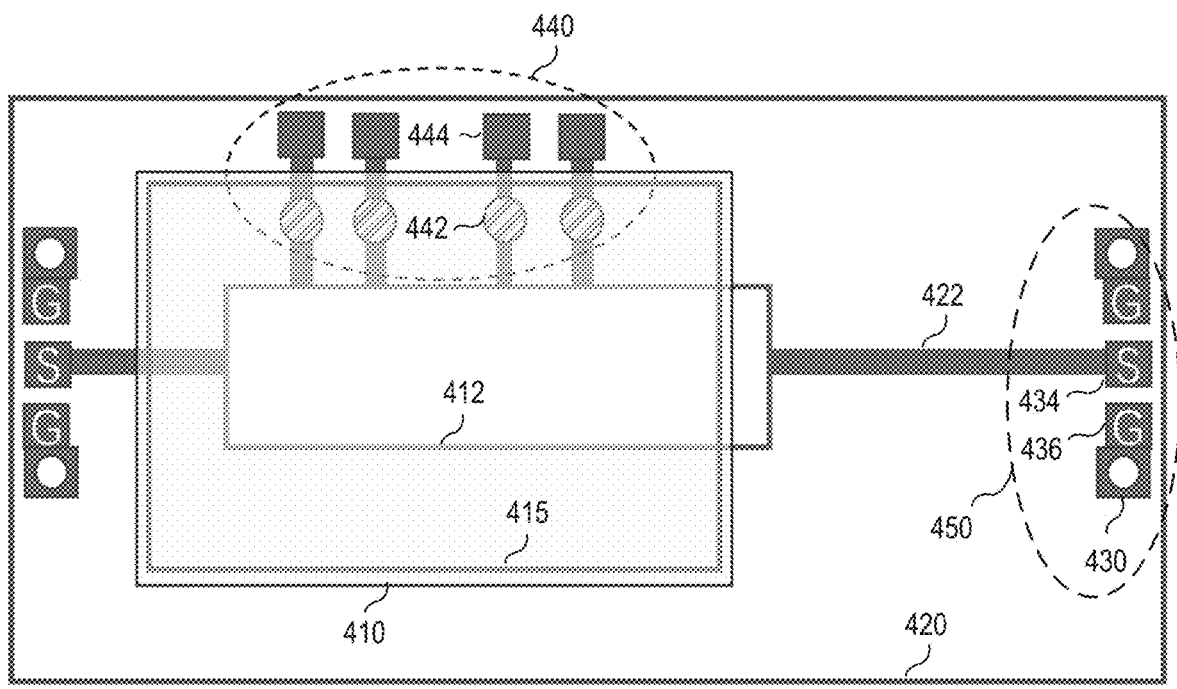
FIG. 4 depicts a top view of a third layout of two stacked dies, according to one or more embodiments of the invention.

FIG. 4 depicts a top view of a third layout of two stacked dies, according to one or more embodiments of the invention. The stacked structure 400 comprises a first die 410 and a second die 420 coupled together via one or more bumping pillars for mechanical and electrical connections. The first die 410 may be a flip die that flips and attaches to the second die 420. The first die 410 may be a silicon-based die and the second die 420 may be an III-V process semiconductor die, such as a GaAs/GaN die. The second die 420 has a backside GND layer and through-substrate GND vias, e.g., 430, to provide a well-defined GND reference for RF signals in both the first die and the second die.

The first die 410 may comprise a control circuit (e.g., a digital logic circuit or an analog biasing circuit) that is used for logic controlling or biasing the second die 420. The second die 420 may comprise an RF circuit 412 such as an RF transmission line, a switch, a digital attenuator, a digital phase shifter, a voltage-controlled oscillator, or an amplifier.

The first die 410 may further comprise one or more first-die control bumping pads 442 connected to respective second-die control bumping pads 444 through corresponding bumping pillars to form a control port 440 between the first die 410 and the second die 420 for bias or logic control.

The RF circuit 412 couples to a second-die signal output pad 434 through a second-die RF signal path 422 for RF signal output. In one or more embodiments, the second-die signal output pad 434 and at least one second-die GND pad (e.g., 436) may form a GSG pad structure 450, which may have a characteristic impedance matching the characteristic impedance of the second-die RF signal path 422 to minimize RF transmission loss. The second-die GND pad 436 may be grounded to the backside GND layer by the through-substrate GND via 430.

In one or more embodiments, the first die 410 may comprise a guard ring 415 that laterally surrounds the first die 410. The guard ring 415 may be floating or grounded by one or more first-die GND bumping pads electrically connected, via corresponding GND bumping pillars, to one or more through-substrate GND vias for a well-defined GND reference for the first die. The guard ring 415 may be a closed ring or an open ring comprising at least one slit.

Embodiments of the third layout of two stacked dies may integrate digital logic circuits and/or analog circuits with III-V semiconductor-based RF chip in a small form factor package with well-defined GND references and capability to handle RF signals over millimeter-wave frequencies. Such a layout may be advantageous for millimeter-wave applications with strict space limitations.

Embodiment 4

Figure 5:
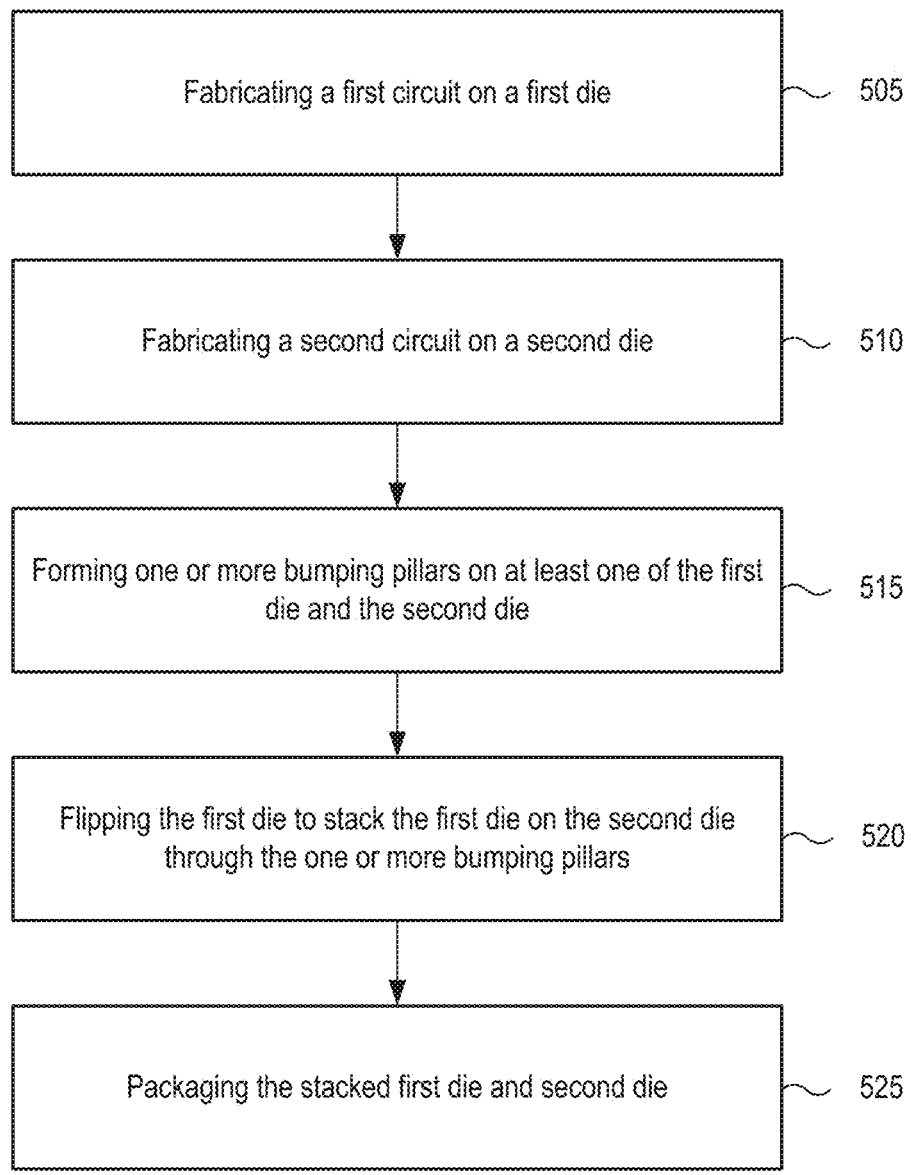
FIG. 5 depicts a process flow for forming a package of two stacked dies, according to one or more embodiments of the invention.

FIG. 5 depicts a process flow for forming a package of two stacked dies, according to one or more embodiments of the invention. In step 505, a first circuit is fabricated on a first die. The first circuit may comprise an RF circuit, a digital logic circuit, or an analog biasing circuit. The first die may be a silicon-based die and may comprise one or more bumping pads. In one or more embodiments, the first die may comprise a guard ring laterally surrounding the first die. The guard ring may be a closed ring or an open ring having at least one slit. In step 510, a second circuit is fabricated on a second die. The second circuit may comprise an RF circuit, e.g., an RF transmission line, a switch, a digital attenuator, a digital phase shifter, a voltage-controlled oscillator, or an RF amplifier. The second die may be an III-V process semiconductor die such as GaAs or GaN die with a backside ground layer. The second die may comprise one or more bumping pads. In one or more embodiments, a GSG (GS or SG) pad structure may be formed as shown in the first, the second, or the third layout. The GSG pad structure may have a characteristic impedance matching the characteristic impedance of an RF signal path in the first or the second die for a low loss RF signal transmission. With characteristic impedance matching, a VSWR equal to or less than 2:1 may be achieved during RF signal transmission.

In step 515, one or more bumping pillars are formed on at least one of the first die and the second die. The one or more bumping pillars may comprise one or more GND bumping pillars for GND connection, one or more RF signal bumping pillars for cross-die RF signal transmission, and one or more control bumping pillars for bias or logic control. In one or more embodiments, a GSG (GS or SG) pillar structure may be formed. The GSG pillar structure may have a characteristic impedance matching the characteristic impedance of an RF signal path in the first or the second die for a low loss RF signal transmission.

In step 520, the first die is flipped to stack on the second die to form a stacked structure with one or more bumping pillars coupled between the first die and the second die. In step 525, the stacked structure is packaged in a plastic or ceramic package with pads of the second die connected to package pins through wirebonds.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims, below, may be arranged differently including having multiple dependencies, configurations, and combinations. For example, in embodiments, the subject matter of various claims may be combined with other claims.

The invention claimed is:

1. A stacked die radio-frequency (RF) circuit structure comprising:
a first die comprising one or more ground (GND) bumping pads and a first-die RF signal path coupled to an RF signal bumping pad on the first die;
a second die comprising a second-die signal pad and a backside GND layer, one or more through-substrate GND vias; and
one or more bumping pillars coupled between the first die and the second die, the one or more bumping pillars comprise one or more GND bumping pillars and one or more RF bumping pillars, the one or more GND bumping pads are grounded to the backside GND layer through the one or more GND bumping pillars and the one or more through-substrate GND vias, the RF signal bumping pad couples to the second-die signal pad through an RF bumping pillar of the one or more RF bumping pillars; and
wherein the one or more GND bumping pads comprise at least one GND bumping pad disposed next to the RF signal bumping pad to construct a pad structure that is a ground-signal-ground (GSG) pad structure, a ground-signal (GS) pad structure, or a signal-ground (SG) pad structure, the pad structure has a characteristic impedance matching the characteristic impedance of the first-die RF signal path.

2. The stacked die RF circuit structure of claim 1 wherein the first die is a silicon-based flipped die and the second die is an III-V process semiconductor die.

3. The stacked die RF circuit structure of claim 1 wherein the first die further comprises a guard ring.

4. The stacked die RF circuit structure of claim 3 wherein the guard ring is a closed ring coupled to at least one GND bumping pad among the one or more GND bumping pads.

5. The stacked die RF circuit structure of claim 1 wherein the second die further comprises an RF amplifier coupled to the first-die RF signal path through a second-die RF signal path, the second-die RF signal path has a characteristic impedance matching the characteristic impedance of the first-die RF signal path.

6. The stacked die RF circuit structure of claim 1 wherein the first die further comprises one or more first-die control bumping pads connected to respective second-die control bumping pads through corresponding bumping pillars to form a control port between the first die and the second die for bias or logic control.

7. A stacked die radio-frequency (RF) circuit structure comprising:
a first die comprising one or more ground (GND) bumping pads and a first-die RF signal path coupled to an RF signal bumping pad on the first die;
a second die comprising a second-die signal pad and a backside GND layer, one or more through-substrate GND vias;
one or more bumping pillars coupled between the first die and the second die, the one or more bumping pillars comprise one or more GND bumping pillars and one or more RF bumping pillars, the one or more GND bumping pads are grounded to the backside GND layer through the one or more GND bumping pillars and the one or more through-substrate GND vias, the RF signal bumping pad couples to the second-die signal pad through an RF bumping pillar of the one or more RF bumping pillars; and
wherein the first die further comprises a guard ring that comprises a stack of back-end-of-line (BEOL) metal structure cross a film layer, a layer of porous dielectric material, and a semiconductor layer.

8. A method of forming a package of stacked die radio-frequency (RF) circuits comprising:
fabricating a first RF circuit on a first die, the first RF circuit comprises one or more ground (GND) pads and an RF signal bumping pad coupled to an RF signal path on the first die;
fabricating a second RF circuit on a second die, the second die comprises a second-die signal pad, a backside GND layer, and one or more through-substrate GND vias;
forming a plurality of bumping pillars on the first die, or the second die, the plurality of bumping pillars comprise one or more GND bumping pillars and one or more RF bumping pillars; and
flipping the first die to stack the first die on the second die through the plurality of bumping pillars, the one or more GND bumping pads are grounded to the backside GND layer through the one or more GND bumping pillars and the one or more through-substrate GND vias, the RF signal bumping pad couples to the second-die signal pad through an RF bumping pillar of the one or more RF bumping pillars; and
wherein the one or more GND bumping pads comprise at least one GND bumping pad disposed next to the RF signal bumping pad to construct a pad structure that is a ground-signal-ground (GSG) pad structure, a ground-signal (GS) pad structure, or a signal-ground (SG) pad structure, the pad structure has a characteristic impedance matching the characteristic impedance of the first-die RF signal path.

9. The method of claim 8 further comprising:
packaging the stacked first die and second die in a plastic or ceramic package with pads of the second die connected to package pins through wirebonds.

10. The method of claim 8 wherein the first die is a silicon-based flipped die and the second die is an III-V process semiconductor die.

11. The method of claim 8 wherein the first RF circuit comprises a guard ring coupled to at least one GND bumping pad among the one or more GND bumping pads.

12. The method of claim 8 wherein the at least one GND bumping pad disposed next to the RF signal bumping pad couples to the second die through at least one GND bumping pillar, the at least one GND bumping pillar and the RF bumping pillar form a GSG bumping pillar structure, a GS bumping pillar structure, or a SG bumping pillar structure.

13. A method of forming a package of stacked die radio-frequency (RF) circuits comprising:
fabricating a first RF circuit on a first die, the first RF circuit comprises one or more ground (GND) pads and an RF signal bumping pad coupled to an RF signal path on the first die;
fabricating a second RF circuit on a second die, the second die comprises a second-die signal pad, a backside GND layer, and one or more through-substrate GND vias;
forming a plurality of bumping pillars on the first die, or the second die, the plurality of bumping pillars comprise one or more GND bumping pillars and one or more RF bumping pillars; and
flipping the first die to stack the first die on the second die through the plurality of bumping pillars, the one or more GND bumping pads are grounded to the backside GND layer through the one or more GND bumping pillars and the one or more through-substrate GND vias, the RF signal bumping pad couples to the second-die signal pad through an RF bumping pillar of the one or more RF bumping pillars; and
wherein the first RF circuit comprises a guard ring coupled to at least one GND bumping pad among the one or more GND bumping pads, the guard ring comprises a stack of back-end-of-line (BEOL) metal structure crosses a film layer, a layer of porous dielectric material, and a semiconductor layer.

* * * * *